(12) United States Patent
Yano et al.

(10) Patent No.: US 12,080,353 B2
(45) Date of Patent: Sep. 3, 2024

(54) SEMICONDUCTOR DEVICE AND ERASING METHOD

(71) Applicant: Winbond Electronics Corp., Taichung (TW)

(72) Inventors: Masaru Yano, Kanagawa (JP); Toshiaki Takeshita, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 149 days.

(21) Appl. No.: 17/988,782

(22) Filed: Nov. 17, 2022

(65) Prior Publication Data

US 2023/0186997 A1     Jun. 15, 2023

(30) Foreign Application Priority Data

Dec. 9, 2021    (JP) ................................ 2021-199805

(51) Int. Cl.
*G11C 16/16*    (2006.01)
*G11C 16/04*    (2006.01)
*G11C 16/34*    (2006.01)

(52) U.S. Cl.
CPC .......... *G11C 16/16* (2013.01); *G11C 16/0483* (2013.01); *G11C 16/3445* (2013.01)

(58) Field of Classification Search
None
See application file for complete search history.

(56) References Cited

U.S. PATENT DOCUMENTS

| 7,768,835 | B2 * | 8/2010 | Goda | G11C 16/344 365/185.27 |
| 8,559,236 | B2 * | 10/2013 | Nakai | G11C 16/26 365/185.11 |
| 9,001,589 | B2 * | 4/2015 | Baek | G11C 11/5635 365/185.29 |
| 9,042,181 | B2 | 5/2015 | Flynn et al. | |
| 2013/0290808 | A1 * | 10/2013 | Mu | G11C 16/3481 714/763 |

(Continued)

FOREIGN PATENT DOCUMENTS

| CN | 1672218 | 9/2005 |
| CN | 111105829 | 5/2020 |

(Continued)

OTHER PUBLICATIONS

"Office Action of Taiwan Counterpart Application", issued on May 18, 2023, p. 1-p. 5.

*Primary Examiner* — Tan T. Nguyen
(74) *Attorney, Agent, or Firm* — JCIPRNET

(57) ABSTRACT

The disclosure provides a semiconductor device and an erasing method that may alleviate the deterioration of a memory cell caused by ISPE. The NAND flash memory in the disclosure includes a memory cell array and an erasing component that erases selected blocks of the memory cell array. The erasing component performs a first erasing verification (EV1) and a second erasing verification (EV2) on the selected block. When the first erasing verification (EV1) passes, and the second erasing verification (EV2) fails, an erase pulse with the same erase voltage as the last time is applied, and when the first erasing verification (EV1) fails, an erase pulse with a step voltage higher than the last time is applied.

13 Claims, 5 Drawing Sheets

(56) References Cited

U.S. PATENT DOCUMENTS

2015/0200019 A1* 7/2015 Chin ................ G11C 16/3445
　　　　　　　　　　　　　　　　　　　　　365/185.17
2017/0229184 A1　8/2017　Yamauchi

FOREIGN PATENT DOCUMENTS

| JP | 2014059945 | 4/2014 |
|----|------------|--------|
| TW | 202038225  | 10/2020 |

* cited by examiner

| Case/Number of times of application | 1 | 2 | 3 | 4 | 5 | 6 | 7 | 8 | 9 |
|---|---|---|---|---|---|---|---|---|---|
| Fresh | Ramp | | | | | | | | |
| Step-1 | Ramp | 14.0V | 14.4V | | | | | | |
| Step-2 | Ramp | 14.0V | 14.4V | 14.4V | | | | | |
| Step-3 | Ramp | 14.0V | 14.4V | 14.4V | 14.4V | | | | |
| Step-4 | Ramp | 14.0V | 14.4V | 14.4V | 14.4V | 14.4V | | | |
| Step-5 | Ramp | 14.0V | 14.4V | 14.4V | 14.4V | 14.4V | 14.4V | | |
| Step-6 | Ramp | 14.0V | 14.4V | 14.8V | | | | | |
| Step-7 | Ramp | 14.0V | 14.4V | 14.8V | 14.8V | | | | |
| Step-8 | Ramp | 14.0V | 14.4V | 14.8V | 14.8V | 14.8V | | | |
| Step-9 | Ramp | 14.0V | 14.4V | 14.8V | 14.8V | 14.8V | 14.8V | | |
| Step-10 | Ramp | 14.0V | 14.4V | 14.8V | 14.8V | 14.8V | 14.8V | 14.8V | |
| Step-11 | Ramp | 14.0V | 14.4V | 14.8V | 15.2V | | | | |
| Step-12 | Ramp | 14.0V | 14.4V | 14.8V | 15.2V | 15.2V | | | |
| Step-13 | Ramp | 14.0V | 14.4V | 14.8V | 15.2V | 15.2V | 15.2V | | |
| Step-14 | Ramp | 14.0V | 14.4V | 14.8V | 15.2V | 15.2V | 15.2V | 15.2V | |
| Step-15 | Ramp | 14.0V | 14.4V | 14.8V | 15.2V | 15.2V | 15.2V | 15.2V | 15.2V |
| Step-16 | Ramp | 14.0V | 14.4V | 14.8V | 15.2V | 15.6V | 15.6V | | |
| Step-17 | Ramp | 14.0V | 14.4V | 14.8V | 15.2V | 15.6V | 15.6V | 15.6V | |

FIG. 6

SEMICONDUCTOR DEVICE AND ERASING METHOD

CROSS-REFERENCE TO RELATED APPLICATION

This application claims the priority benefit of Japan application serial no. 2021-199805, filed on Dec. 9, 2021. The entirety of the above-mentioned patent application is hereby incorporated by reference herein and made a part of this specification.

BACKGROUND

Technical Field

The disclosure relates to a NAND flash memory, and more particularly, to the control of an erase pulse when a memory unit is erased.

Description of Related Art

In a NAND flash memory, in order to control the threshold distribution of a memory cell during erasing, an incremental step pulse erase (ISPE) mode is adopted. As shown in FIG. 1, an erase pulse Vers0 is applied to a P-type well in selected blocks by ISPE. When it is determined to be failed by an erasing verification, an erase pulse Vers1 with a step voltage higher than the erase pulse Vers0 is applied, and erasing is performed by increasing a voltage of the erase pulse until the erasure of all the memory cells in the blocks is determined to be passed. In addition, when the number of times of application of the erase pulse reaches the maximum allowable number of times of application, the blocks is managed as bad blocks, and the erasing ends.

SUMMARY

In a NAND flash memory, if the programming/erasing operations are repeatedly performed, Gm (transconductance) is deteriorated, and it is difficult for a current to flow to a memory cell, and a threshold of the memory cell is gradually shifted to a positive direction. Since the erasing of the memory cell reduces the threshold in a negative direction, if the number of times of repeated programming/erasing increases, the erasing becomes difficult and the erasing speed is slow.

In the previous ISPE, the memory cell is deteriorated due to the repeated programming/erasing, and the erasing speed is slow. The erasing time is shortened by increasing a voltage of an erase pulse, but increasing the voltage of the erase pulse is also a reason for accelerating the deterioration of the memory cell. Since an erasing verification of a selected block is performed in units of blocks, when the block includes a sufficiently erased NAND string and an insufficiently erased NAND string, the erasing verification fails, and an erase pulse with a higher step voltage is applied to the selected block. Therefore, excessive voltage stress is applied to the memory cell with the fully erased NAND string, which accelerates the deterioration of the memory cell. As a result, the durability characteristics are also deteriorated.

An object of the disclosure is to solve such a phenomenon and to provide a semiconductor device and an erasing method that may alleviate the deterioration of the memory cell caused by ISPE.

An erasing method of a NAND flash memory in the disclosure includes the following. An erase pulse is applied to a selected block of a memory cell array. A first erasing verification is performed on the selected block with a first readout voltage. A second erasing verification is performed on the selected block with a second readout voltage lower than the first readout voltage. The next erase pulse to be applied is controlled based on the first erasing verification and the second erasing verification. The step of controlling includes applying an erase pulse with a same erase voltage as last time.

In an embodiment, the step of controlling includes applying the erase pulse with the same erase voltage as the last time between thresholds specified by the first erasing verification and the second erasing verification. In an embodiment, in the step of controlling, when the first erasing verification passes, and the second erasing verification fails, the erase pulse with the same erase voltage as the last time is applied, and when the first erasing verification fails, an erase pulse with a step voltage higher than the last time is applied. In an embodiment, the step of controlling is set as follows. When a number of times of applying the erase pulse with the same erase voltage as the last time reaches a predetermined number Q, the erase voltage of the erase pulse applied to the selected block during erasing after a next programming is increased by a step voltage. In an embodiment, in the step of controlling, the predetermined number Q is set such that a shift amount of the threshold when the erase pulse of the predetermined number Q is applied is equal to a shift amount of the threshold when the erase pulse with the higher step voltage is applied. In an embodiment, when time allowed for erasing is set to Tmax, and application time for the next erase pulse is set to Tp, an allowable number of times of application Nmax of the erase pulse is Nmax=Tmax/Tp. In the step of controlling, the predetermined number Q is set based on the allowable number of times of application Nmax. In an embodiment, the step of applying includes applying an initial erase pulse to form a state in which the threshold of a memory cell is shifted slowly and substantially linearly in a negative direction. In the step of controlling, the next erase pulse after the initial erase pulse is applied is controlled.

A semiconductor device in the disclosure includes a NAND memory cell array and an erasing component that erases a selected block of the memory cell array. The erasing component performs a first erasing verification on the selected block with a first readout voltage, performs a second erasing verification with a second readout voltage lower than the first readout voltage, controls a next erase pulse to be applied based on the first erasing verification and the second erasing verification, and applies an erase pulse with a same erase voltage as last time between thresholds specified by the first erasing verification and the second erasing verification.

In an embodiment, when the first erasing verification passes, and the second erasing verification fails, the erasing component applies the erase pulse with the same erase voltage as the last time, and when the first erasing verification fails, the erasing component applies an erase pulse with a step voltage higher than the last time. In an embodiment, the erasing component is set as follows. When a number of times of applying the erase pulse with the same erase voltage as the last time reaches a predetermined number Q, the erase voltage of the erase pulse applied to the selected block during erasing after a next programming is increased by a step voltage. In an embodiment, the erasing component sets the predetermined number Q such that a shift amount of the threshold when the erase pulse of the predetermined number Q is applied is equal to a shift amount of the threshold when the erase pulse with the higher step voltage is applied. In an embodiment, when time allowed for erasing is set to Tmax, and application time for the next erase pulse is set to Tp, an allowable number of times of application Nmax of the erase pulse is Nmax=Tmax/Tp. The erasing component sets the predetermined number Q based on the allowable number of times of application Nmax. In an embodiment, the erasing component applies an initial erase pulse to form a state in which the threshold of a memory cell is shifted slowly and substantially linearly in a negative direction, and controls the next erase pulse after the initial erase pulse is applied.

According to the disclosure, it is set to control the next erase pulse to be applied based on the first erasing verification and the second erasing verification. Therefore, the erase voltage of the next erase pulse to be applied may be set to the same erase voltage as the last time, thereby suppressing the deterioration of the memory cell from accelerating.

BRIEF DESCRIPTION OF THE DRAWINGS

FIG. 6 is a table of a relationship between an erase pulse by ISPE and the number of times of application according to an embodiment of the disclosure.

DETAILED DESCRIPTION OF DISCLOSED EMBODIMENTS

Figure 1:
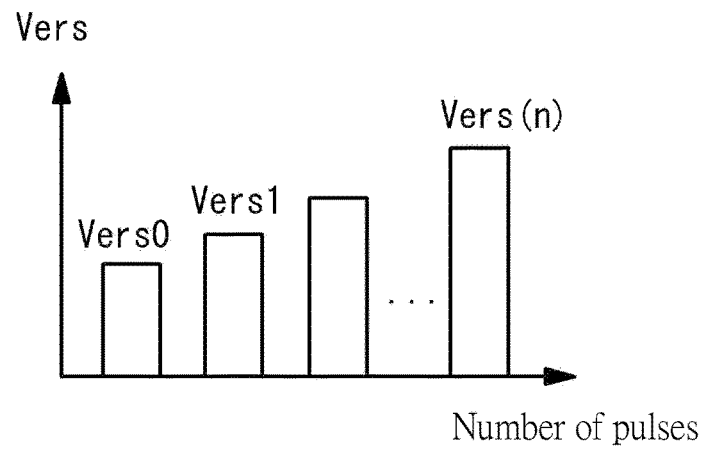
FIG. 1 is a step diagram of a voltage of a flash memory erased by ISPE in the related art.
Figure 2:
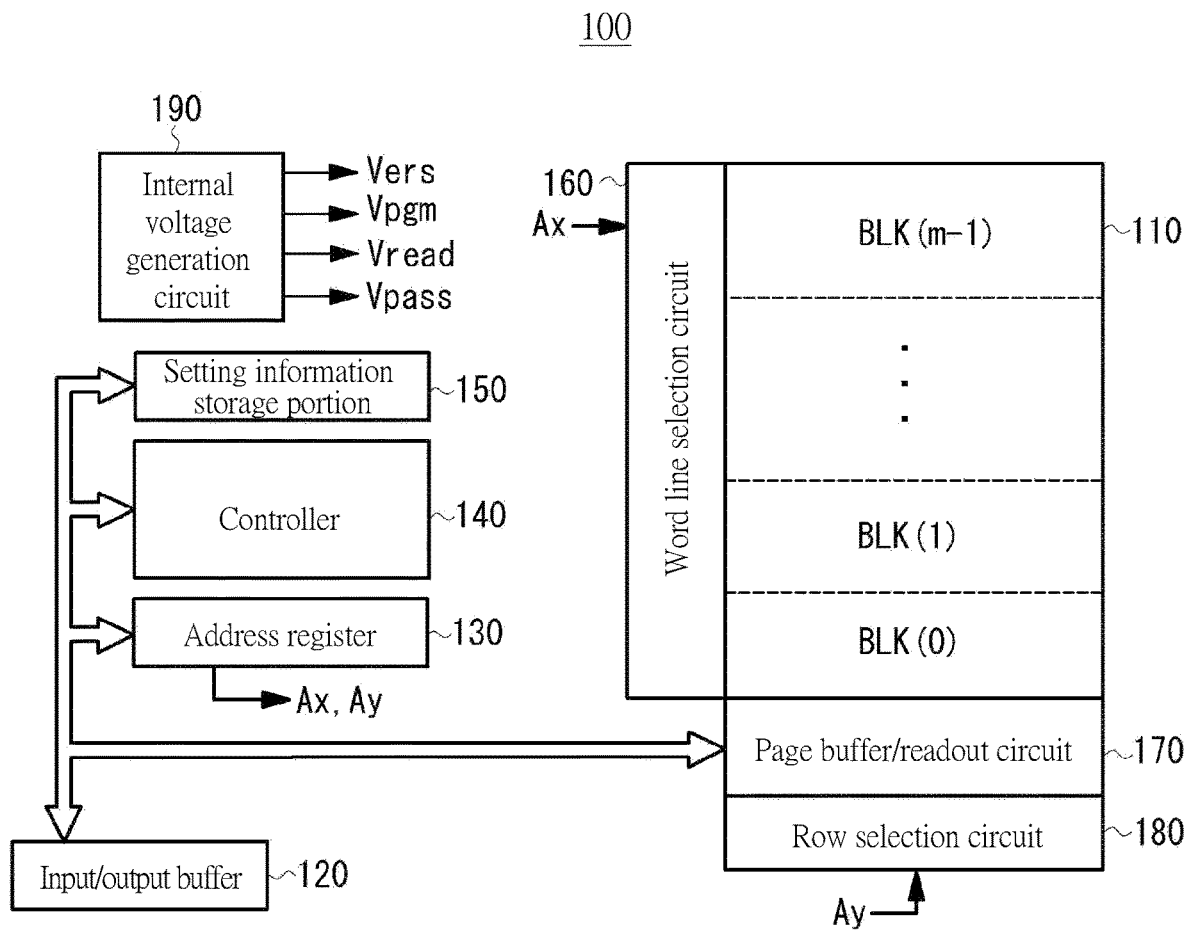
FIG. 2 is a block diagram of a structure of a NAND flash memory according to an embodiment of the disclosure.

FIG. 2 is a block diagram of a structure of a NAND flash memory according to an embodiment of the disclosure. A structure of a flash memory 100 in this embodiment includes the following. A memory cell array 110 is formed by arranging multiple memory cells in a matrix shape. An input/output buffer 120 outputs read data to the outside or imports data input from the outside. An address register 130 holds address data input through the input/output buffer 120. A controller 140 controls each of portions based on command data received through the input/output buffer 120 or a control signal applied to an external terminal. A setting information storage portion 150 stores setting information about ISPE, etc. A word line selection circuit 160 performs block selection, word line selection, etc. based on column address information Ax from the address register 130. A page buffer/readout circuit 170 holds data read from a selected page of the memory cell array 110 or holds the data for programming in the selected page. A row selection circuit 180, based on row address information Ay from the address register 130, performs row selection, etc. in the page buffer/readout circuit 170. An internal voltage generation circuit 190 generates various voltages (a program voltage Vpgm, a pass voltage Vpass, a readout voltage Vread, an erase voltage Vers, etc.) required for reading, programming, and erasing.

The memory cell array 110 has, for example, m blocks BLK arranged in a row direction. Each of the blocks includes multiple NAND strings. One NAND string includes the memory cells, a bit line side selection transistor, and a source line side selection transistor connected in series. The bit line side selection transistor is connected to a corresponding global bit line, and the source line side selection transistor is connected to a common source line. A gate of each of the memory cells is connected to a word line. Each of gates of the bit line side selection transistor and the source line side selection transistor are connected to a selection gate line. A word line WL and the selection gate line are driven by the word line selection circuit 160. In addition, each of bit lines is connected to the page buffer/readout circuit 170 through a bit line selection circuit for selecting an even bit line or an odd bit line.

The setting information storage portion 150 stores an initial value of an erase pulse, a step voltage, a maximum number of times of application of the erase pulse, a predetermined number Q, etc. as the setting information about ISPE. In an embodiment, when the power is turned on, the setting information read from a fuse cell of the memory cell array 110 is loaded into the setting information storage portion 150.

The word line selection circuit 160 drives the memory cells through the word line WL based on the column address Ax, and also drives the bit line side selection transistor and the source line side selection transistor through the selection gate line to select the blocks and pages. The row selection circuit 180 selects the global bit line according to the row address Ay, for example, to select a start position of reading the data in the page.

The controller 140 is formed by a micro controller or a state machine including a read only memory (ROM)/random access memory (RAM), etc., and controls operation of the flash memory 100. In a readout operation, a certain positive voltage is applied to the bit line; a certain voltage (e.g., 0 V) is applied to the selected word line; a pass voltage (e.g., 4.5 V) is applied to the unselected word line to turn on the bit line side selection transistor and the source line side selection transistor, and 0 V is applied to the common source line. In a programming operation, the high-voltage program voltage Vpgm (e.g., 15 V to 20 V) is applied to the selected word line, and an intermediate potential (e.g., 10 V) is applied to the unselected word line, so that the bit line side selection transistor is turned on, and that the source line side selection transistor is turned off, and the potential corresponding to the data of "0" or "1" is supplied to the bit line.

In an erasing operation, 0 V is applied to the selected word line in the block, and the erase voltage Vers is applied to a P-type well, so as to extract electrons of a floating gate to a substrate, thereby erasing the data in units of blocks. The erase voltage is determined according to an ISPE algorithm.

Next, an erasing method based on ISPE in this embodiment will be described. In the conventional ISPE, when an erasing verification fails, the erase voltage of the next erase pulse to be applied is increased by one step. However, the method is overstress for the memory cells with a fast erasing speed, and there is a possibility that deterioration of the memory cells may be accelerated.

On the other hand, the time allowed for erasing is determined in consideration of durability characteristics and the like, for example, when the erasing speed becomes slow when the number of P/E cycles is 100 K as a reference. In the conventional ISPE, when the erasing verification fails, the time allowed for erasing is not considered, that is, the voltage of the erase pulse is increased even though the time allowed for erasing is sufficiently long.

In ISPE of this embodiment, when the erasing verification fails, instead of uniformly increasing the voltage of the erase pulse, the time allowed for erasing may be effectively utilized, and the erase pulse with the same erase voltage as the last time may be repeatedly applied at the same time, so that no overstress is applied to the memory cells with the fast erasing speed, thereby alleviating the deterioration of the memory cells.

Figure 3:
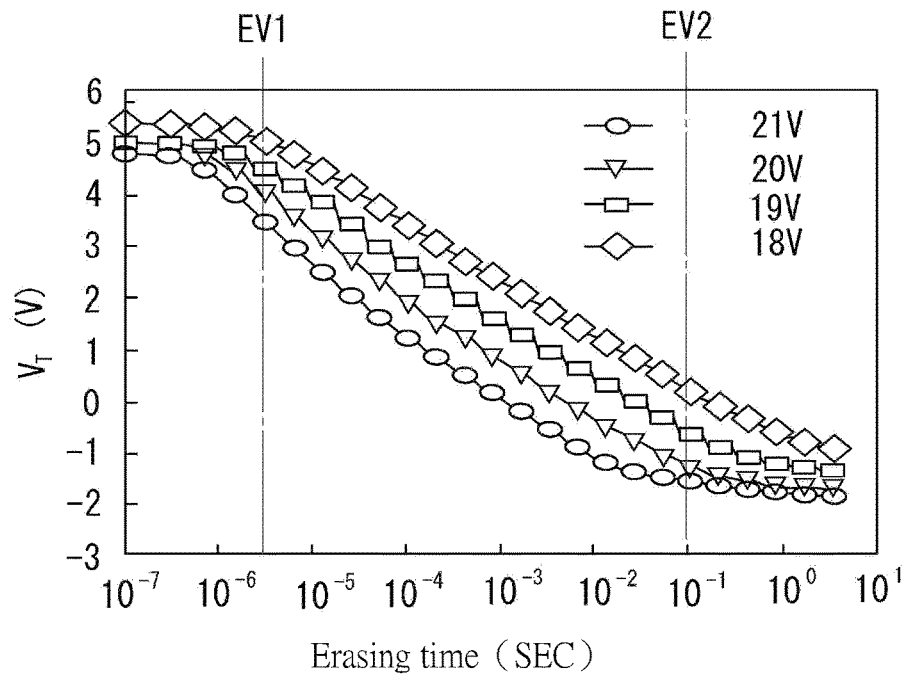
FIG. 3 is a diagram of a relationship between a threshold of a memory cell and erasing time.

FIG. 3 is a diagram of a relationship between the erase pulse applied with various erase voltages at certain time intervals, a threshold of the memory cell, and erasing time (in which a horizontal axis is a logarithm). The application of the erase pulse with the erase voltages of 18 V, 19 V, 20 V, and 21 V is shown here. As shown in FIG. 3, when the erase pulse with the same erase voltage is repeatedly applied, the threshold is shifted substantially linearly in a negative direction at about $5\times10^{-6}$ from an erasing start time, and the shift of the threshold saturates and becomes substantially constant at about $10^{-1}$ of the erasing start time. When the erase voltage is large (21 V compared to 18 V), a negative threshold voltage at saturation is large.

According to FIG. 3, the threshold hardly changes from the start of erasing to a certain period of time (to around $5\times10^{-6}$). However, when the erase pulse with the same erase voltage is applied, the threshold changes slowly and substantially linearly.

In ISPE of this embodiment of the disclosure, the voltage of the erase pulse is determined by using the characteristic that the threshold changes slowly and linearly. For example, in an erasing period of $5\times10^{-6}$ to $1\times10^{-1}$ shown in FIG. 3, or within a range of the threshold corresponding to the erasing period, a first erasing verification EV1 and a second erasing verification EV2 are performed on the selected block to verify whether the threshold of the memory cell is within the range. When the threshold of the memory cell exists between the first erasing verification EV1 and the second erasing verification EV2, the erase pulse with the same erase voltage is applied to the selected block as much as possible.

However, since the time allowed for erasing is limited, it is also necessary to set an upper limit on the number of times of applying the erase pulse with the same voltage. For example, when the time allowed for erasing is set to Tmax, and the application time of one erase pulse is set to Tp (in which the application time of each of the erase pulses is equal), an allowable number of times of application Nmax of the erase pulse is Nmax=Tmax/Tp. Based on the allowable number of times of application Nmax, the number of erase pulses that may be applied at the same voltage may be determined.

Figure 4:
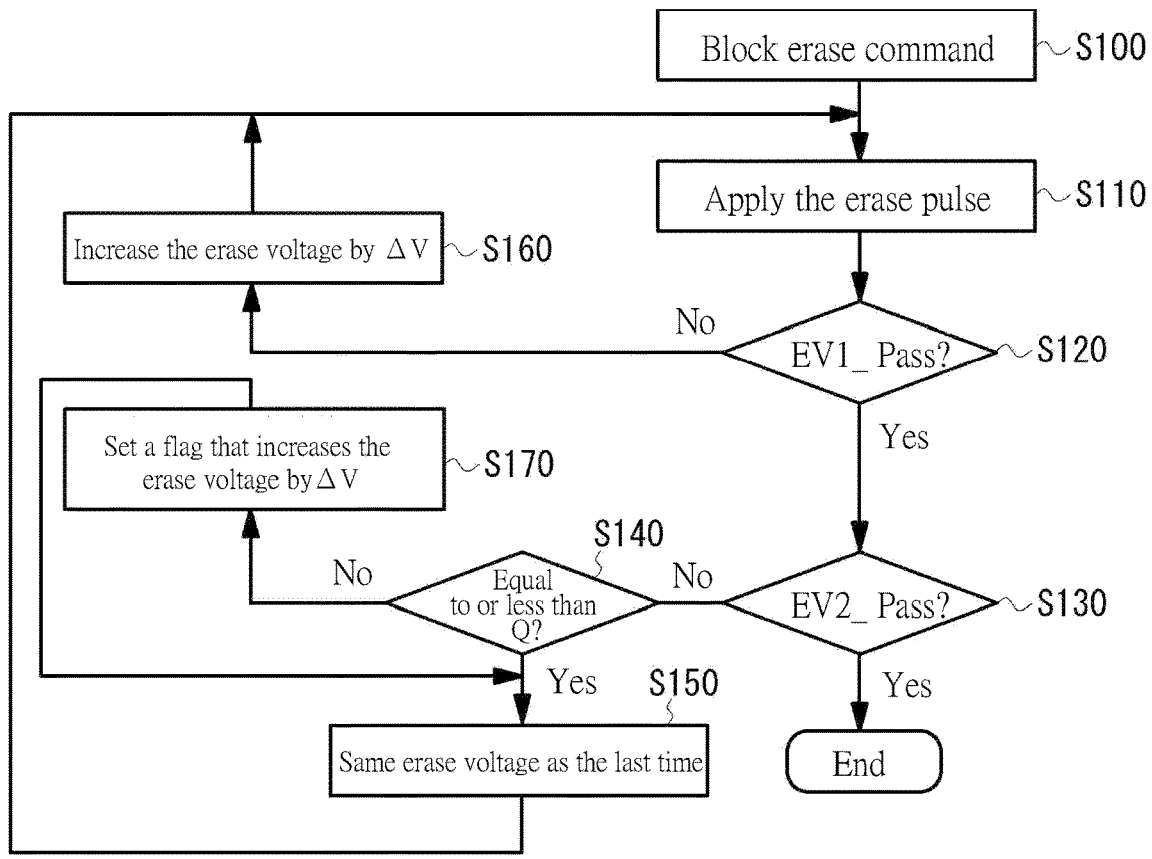
FIG. 4 is a flowchart of an erasing operation of a flash memory according to an embodiment of the disclosure.

FIG. 4 is a flowchart of an operation of ISPE according to an embodiment of the disclosure. The controller 140 executes the ISPE algorithm in response to an erase command and address input from the outside, or in response to an internal erase command for enabling garbage collection to be performed internally (S100).

The controller 140 sets the word line of the block selected by the word line selection circuit 160 to a GND level, and applies the erase pulse to the P-type well (S10). As an initial sequence, one or more initial erase pulses are applied in such a way that the threshold of the memory cell enters a region where the threshold changes slowly and linearly as shown in FIG. 3.

Next, the controller 140 performs the erasing verification EV1 on the selected block (S120). In the erasing verification EV1, a verification readout voltage Vg1 is applied to each of the word lines of the selected block to verify an erase state of each of the NAND strings of the selected block.

Figure 5A:
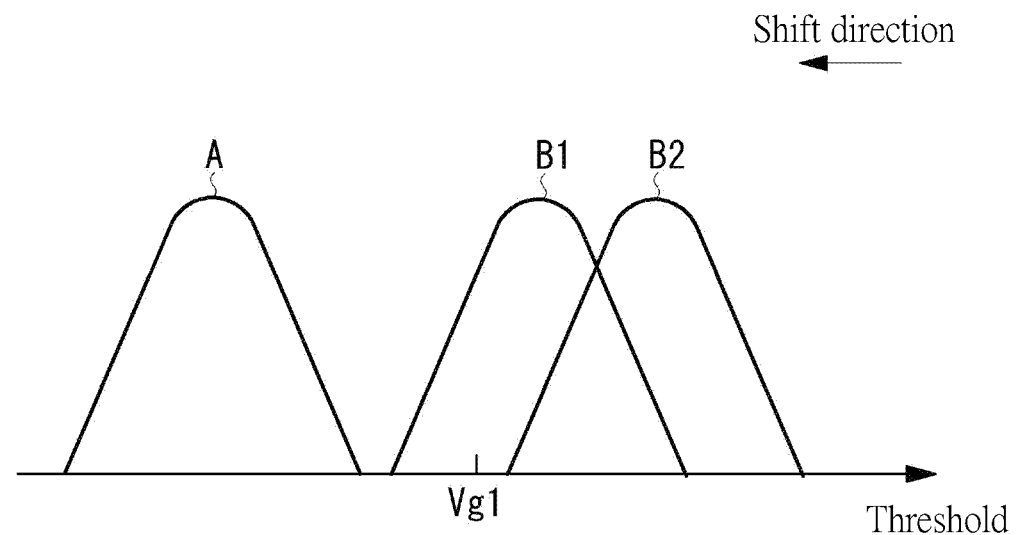
FIG. 5A is a diagram of a relationship between threshold distribution and an erasing verification EV1.

FIG. 5A is a diagram schematically showing a relationship between the erasing verification EV1 and threshold distribution of the memory cells. If the thresholds of all the memory cells (or the NAND strings) are less than the verification readout voltage Vg1 as in threshold distribution A, the erasing verification EV1 passes. On the other hand, if the thresholds of some of the memory cells are greater than the verification readout voltage Vg1 as in threshold distribution B1, the erasing verification EV1 fails. In addition, when a lower limit value does not reach the verification read voltage Vg1 as in threshold distribution B2, the erasing verification EV1 also fails.

When the erasing verification EV1 fails, it is determined that the threshold of the memory cell of the selected block has not been shifted sufficiently in the negative direction, in other words, has not reached the region where the threshold changes slowly and linearly as shown in FIG. 3. In this case, the controller 140 increases the erase voltage of the next erase pulse by one step (S160), and applies the increased erase pulse to the selected block (Si 10).

Figure 5B:
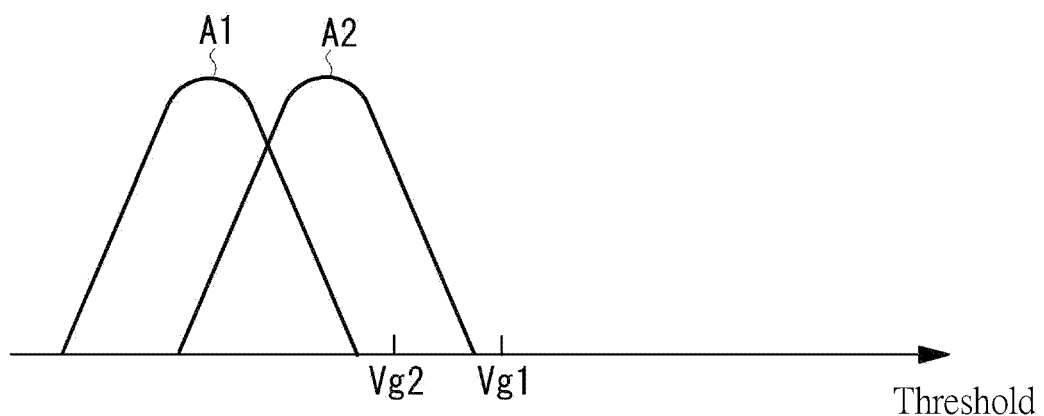
FIG. 5B is a diagram of a relationship between the threshold distribution and an erasing verification EV2.

On the other hand, when the erasing verification EV1 passes, the second erasing verification EV2 is performed (S130). The erasing verification EV2 is performed by using a verification readout voltage Vg2 less than the verification readout voltage Vg1. FIG. 5B is a diagram schematically showing a relationship between the erasing verification EV2 and the threshold distribution of the memory cells. If the thresholds of all the memory cells in the threshold distribution A that have passed the erasing verification EV1 as in threshold distribution A1 are less than the verification readout voltage Vg2, the erasing verification EV2 passes. However, if even some of the thresholds are greater than the verification readout voltage Vg2 as in threshold distribution A2, the erasing verification EV2 also fails.

When the erasing verification EV2 passes (step S130), erasing of the selected block ends. When the erasing verification EV2 fails, the controller 140 determines the voltage of the next erase pulse. In this case, the controller 140 determines whether the number of times of application of the erase pulse with the same voltage has reached the predetermined value Q (S140). If it is equal to or less than the predetermined value Q, it is determined that the erase voltage of the next erase pulse is the same as the last time (S150), and the erase pulse with the same erase voltage as the last time is applied to the selected block (S110). When the predetermined value Q is exceeded, the controller 140 sets a flag for increasing the erase voltage of the erase pulse by one step in the memory (S170). When erasing the next programmed block, the controller 140 refers to the flag and applies the erase pulse whose erase voltage is increased by one step voltage to the selected block. After the flag is set, the controller 140 determines that the erase voltage of the next erase pulse is the same as the last time (S150), and applies the erase pulse with the same erase voltage as the last time to the selected block (S110).

Processes of step S110 to step S170 are repeatedly performed until the erasing verification EV2 passes, and the application of the erase pulse is performed repeatedly and slowly. However, when the number of times of application of the erase pulse reaches the allowable number of times of application Nmax, the selected block is managed as a bad block, and the erasing ends.

According to the erasing method in the embodiment of the disclosure, the time allowed for erasing may be effectively utilized, and the erase pulse with the same erase voltage as the last time may be repeatedly applied at the same time. Therefore, it is possible to prevent excessive voltage stress from being applied to the memory cells with the fast erasing speed, and to alleviate the deterioration of the memory cells. As a result, the durability characteristics of the flash memory may be improved compared to the conventional ISPE.

Figure 7A:
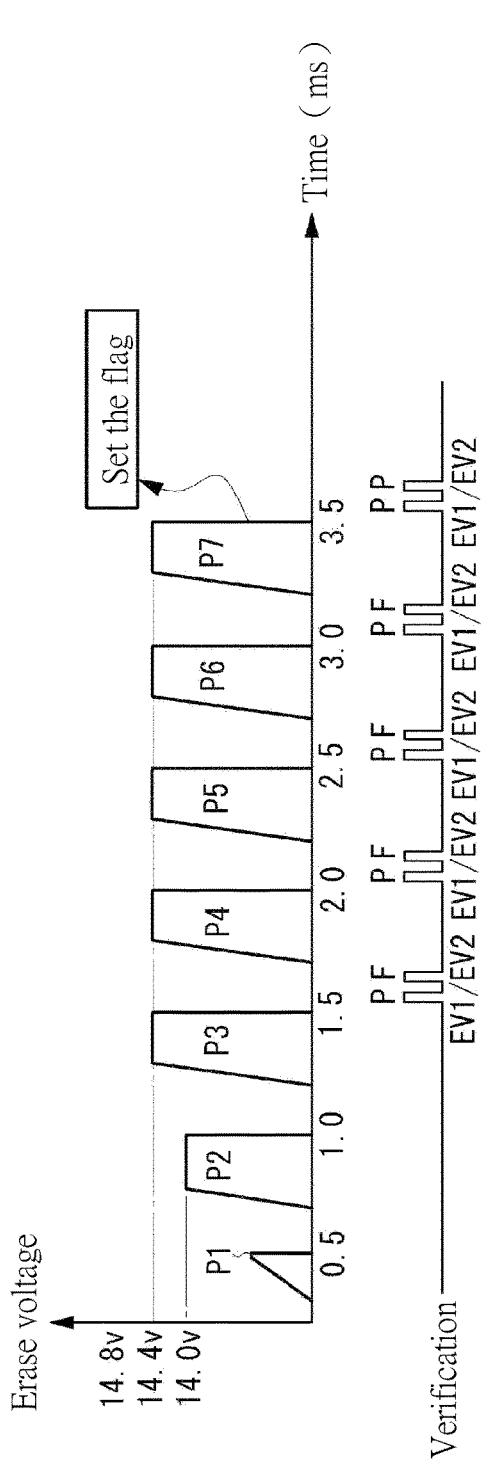
FIGS. 7A and 7B are diagrams of application examples of an erase pulse based on ISPE according to an embodiment of the disclosure.
Figure 7B:
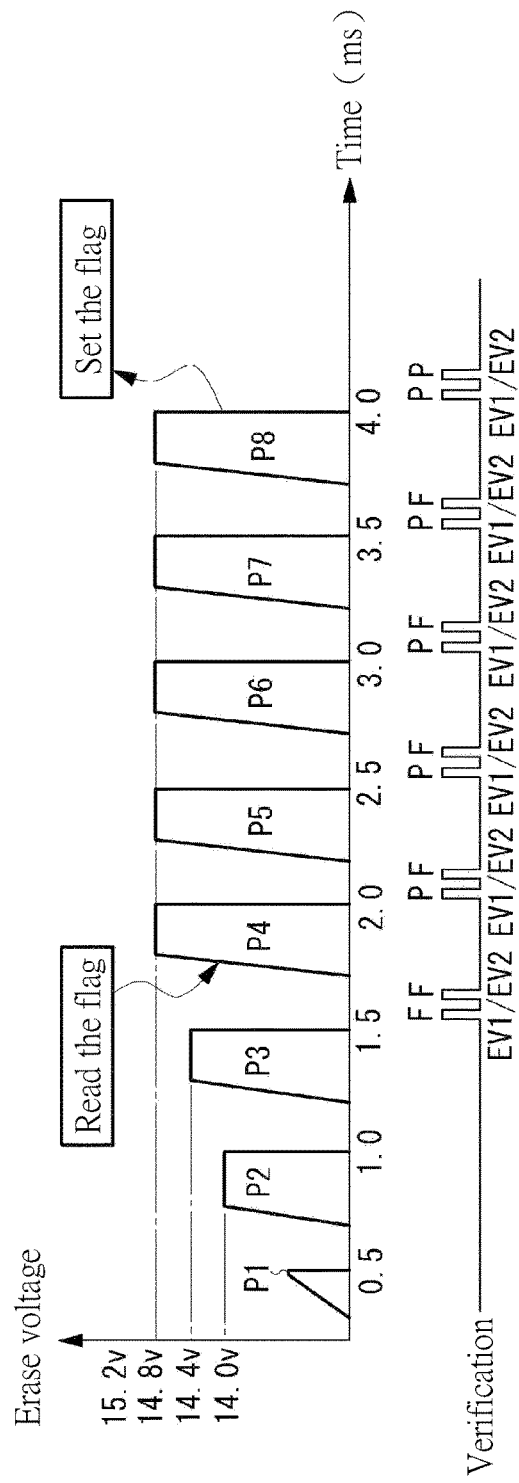

Next, a specific example of ISPE according to the embodiment of the disclosure will be described. FIG. 6 is a table showing an example of the erase voltage and the number of times of application of the erase pulse. FIG. 7A is an example of erasing of "Step-4" in FIG. 6, and FIG. 7B is an example of erasing of "Step-9" in FIG. 6. As an initial sequence of erasing, a ramp erase pulse P1, an erase pulse P2 with a peak value of 14.0 V, and an erase pulse P3 with a peak value of 14.4 V are applied. The initial sequence is implemented to shift the threshold of the memory cell of the selected block into the region where the threshold changes slowly and linearly. The application time of each of the erase pulses is set to 500 us. The verification readout voltage of the erasing verification EV1 is set to Vg1=1.4 V, and the verification readout voltage of the erasing verification EV2 is set to Vg2=1.0 V. In addition, a shift amount of the threshold when the erase pulse of 14.4 V is applied x the predetermined value Q is substantially equal to a shift amount of the threshold when the erase pulse of 14.8 V with the higher step voltage is applied. Here, the predetermined value Q of the number of times of applying the erase pulse with the same erase voltage as the last time is set to five.

As shown in "Fresh" in FIG. 6, for the selected block with a small number of P/E cycles, as the initial sequence of erasing, the ramp erase pulse P1 (500 us)→the erase pulse P2 (14 V, 500 us)→the erase pulse P3 (14.4 V, 500 us) are applied. After 1.5 ms, the erasing verification EV1 and the erasing verification EV2 are performed.

(1) When the erasing verification EV1 and the erasing verification EV2 pass respectively, the erasing ends.

(2) When the erasing verification EV1 passes, and the erasing verification EV2 fails, as shown in "Step-1", an erase pulse P4 (14.4 V, 500 us) is applied.

(3) After 2.0 ms, when the erasing verification EV1 and the erasing verification EV2 pass respectively, the erasing ends. When the erasing verification EV1 passes, and the erasing verification EV2 fails, as shown in "Step-2", an erase pulse P5 (14.4 V, 500 us) is applied.

(4) After 2.5 ms, when the erasing verification EV1 and the erasing verification EV2 pass respectively, the erasing ends. When the erasing verification EV1 passes, and the erasing verification EV2 fails, as shown in "Step-3", the erase pulse P5 (14.4 V, 500 us) is applied.

(5) After 3.0 ms, when the erasing verification EV1 and the erasing verification EV2 pass respectively, the erasing ends. When the erasing verification EV1 passes, and the erasing verification EV2 fails, as shown in "Step-4", an erase pulse P6 (14.4 V, 500 us) is applied.

(6) In Step-4, since the application of the erase pulse P6 reaches the predetermined number Q, the flag for increasing the erase voltage by one step voltage is set. By setting the flag, the erase voltage of the erase pulse when the next erasing is performed on the block is set to 14.8 V. Therefore, in the erasing of the selected block after the next programming, as indicated in "Step-5", after the application of the initial sequence of erasing (the erase pulse P1, the erase pulse P2, and the erase pulse P3), the erase pulse (14.8 V, 500 us) is applied.

In FIG. 7A, after the application of the erase pulse P1, the erase pulse P2, and the erase pulse P3 as the initial sequence, the erasing verification EV1 passes, and the erasing verification EV2 fails. The erase pulse P4 with the same voltage as the erase pulse P3 is applied, and then the erasing verification EV2 also fails continuously. The erase pulse P5, the erase pulse P6, and an erase pulse P7 with the same voltage as the erase pulse P3 are repeatedly applied, and by applying the erase pulse P7, the erasing verification EV2 passes (the example of erasing of "Step-4" in FIG. 6). In this case, since the number of times of application of the erase pulse of 14.4 V has reached the predetermined value Q (=5), the flag for increasing the erase voltage of the erase pulse by one step voltage is set.

FIG. 7B is an example of erasing when the flag for increasing one step voltage was set in the last erasing ("Step-9" in FIG. 6). That is, after the application of the erase pulse P1, the erase pulse P2, and the erase pulse P3 as the initial sequence, according to the flag set in the last erasing, the erase pulse P4 (14.8) increased by one step voltage is applied. At 2.0 ms, the erasing verification EV1 passes, and the erasing verification EV2 fails. The erase pulse P5 with the same voltage as the erase pulse P4 is applied, and then the erasing verification EV2 also fails continuously. The erase pulse P5, the erase pulse P6, the erase pulse P7, and an erase pulse P8 with the same voltage as the erase pulse P4 are repeatedly applied, and by applying the erase pulse P8, the erasing verification EV2 passes. Since the number of times of application of the erase pulse of 14.8 V has reached the predetermined value Q (=5), the flag for increasing the erase voltage of the erase pulse by one step voltage is set.

The erase voltage of the erase pulse, the application time of the erase pulse, the step voltage, the predetermined value Q, etc., described in the above embodiments are examples, and the values may be appropriately changed according to specifications required by the NAND flash memory.

The embodiments of the disclosure have been described in detail above, but the disclosure is not limited thereto, and various modifications and changes may be made without departing from the scope of the disclosure.

What is claimed is:

1. An erasing method of a NAND flash memory, wherein the erasing method comprises:
    applying an erase pulse to a selected block of a memory cell array;
    performing a first erasing verification on the selected block with a first readout voltage;
    performing a second erasing verification on the selected block with a second readout voltage lower than the first readout voltage; and
    controlling the next erase pulse to be applied based on the first erasing verification and the second erasing verification,
    wherein the step of controlling comprises applying an erase pulse with a same erase voltage as last time.

2. The erasing method according to claim 1, wherein the step of controlling comprises applying the erase pulse with the same erase voltage as the last time between thresholds specified by the first erasing verification and the second erasing verification.

3. The erasing method according to claim 2, wherein in the step of controlling, when the first erasing verification passes, and the second erasing verification fails, the erase pulse with the same erase voltage as the last time is applied, and when the first erasing verification fails, an erase pulse with a step voltage higher than the last time is applied.

4. The erasing method according to claim 2, wherein the step of controlling is set as follows, when a number of times of applying the erase pulse with the same erase voltage as the last time reaches a predetermined number Q, the erase voltage of the erase pulse applied to the selected block during erasing after a next programming is increased by a step voltage.

5. The erasing method according to claim 4, wherein in the step of controlling, the predetermined number Q is set such that a shift amount of the threshold when the erase pulse of the predetermined number Q is applied is equal to a shift amount of the threshold when the erase pulse with the higher step voltage is applied.

6. The erasing method according to claim 4, wherein when time allowed for erasing is set to Tmax, and application time for the next erase pulse is set to Tp, an allowable number of times of application Nmax of the erase pulse is Nmax=Tmax/Tp, in the step of controlling, the predetermined number Q is set based on the allowable number of times of application Nmax.

7. The erasing method according to claim 2, wherein the step of applying comprises applying an initial erase pulse to form a state in which the threshold of a memory cell is shifted slowly and substantially linearly in a negative direction, in the step of controlling, the next erase pulse after the initial erase pulse is applied is controlled.

8. A semiconductor device, comprising a NAND memory cell array; and an erasing component erasing a selected block of the memory cell array, wherein the erasing component performs a first erasing verification on the selected block with a first readout voltage, performs a second erasing verification with a second readout voltage lower than the first readout voltage, controls a next erase pulse to be applied based on the first erasing verification and the second erasing verification, and applies an erase pulse with a same erase voltage as last time between thresholds specified by the first erasing verification and the second erasing verification.

9. The semiconductor device according to claim 8, wherein when the first erasing verification passes, and the second erasing verification fails, the erasing component applies the erase pulse with the same erase voltage as the last time, and when the first erasing verification fails, the erasing component applies an erase pulse with a step voltage higher than the last time.

10. The semiconductor device according to claim 9, wherein the erasing component applies an initial erase pulse to form a state in which the threshold of a memory cell is shifted slowly and substantially linearly in a negative direction, and controls the next erase pulse after the initial erase pulse is applied.

11. The semiconductor device according to claim 8, wherein the erasing component is set as follows, when a number of times of applying the erase pulse with the same erase voltage as the last time reaches a predetermined number Q, the erase voltage of the erase pulse applied to the selected block during erasing after a next programming is increased by a step voltage.

12. The semiconductor device according to claim 11, wherein the erasing component sets the predetermined number Q such that a shift amount of the threshold when the erase pulse of the predetermined number Q is applied is equal to a shift amount of the threshold when the erase pulse with the higher step voltage is applied.

13. The semiconductor device according to claim 12, wherein when time allowed for erasing is set to Tmax, and application time for the next erase pulse is set to Tp, an allowable number of times of application Nmax of the erase pulse is Nmax=Tmax/Tp, the erasing component sets the predetermined number Q based on the allowable number of times of application Nmax.

* * * * *